United States Patent [19]

Venambre

[11] Patent Number: 5,438,750
[45] Date of Patent: Aug. 8, 1995

[54] METHOD OF MANUFACTURING A CHIP CARD

[75] Inventor: Jacques Venambre, IFS Plaine, France

[73] Assignee: U.S. Philips Corporation, New York, N.Y.

[21] Appl. No.: 360,185

[22] Filed: Dec. 20, 1994

Related U.S. Application Data

[63] Continuation of Ser. No. 892,099, Jun. 2, 1992, abandoned.

[30] Foreign Application Priority Data

Jun. 17, 1991 [FR] France ................................. 91 07371

[51] Int. Cl.$^6$ .............................................. H05K 3/00
[52] U.S. Cl. ........................................ 29/829; 29/827; 235/488; 235/492
[58] Field of Search ................... 29/827, 829; 235/488, 235/492

[56] References Cited

U.S. PATENT DOCUMENTS

| | | | |
|---|---|---|---|
| 4,483,067 | 11/1984 | Parmentier | 235/492 X |
| 4,649,418 | 3/1987 | Uden . | |
| 4,701,236 | 10/1987 | Vielledent | 156/252 |
| 4,737,620 | 4/1988 | Mollet et al. | 235/488 X |
| 4,897,534 | 1/1990 | Haghiri-Tehrani | 235/488 |
| 5,057,679 | 10/1991 | Audie et al. | 235/488 X |
| 5,067,008 | 11/1991 | Yanaka et al. . | |

FOREIGN PATENT DOCUMENTS

| | | |
|---|---|---|
| 0334733 | 9/1989 | European Pat. Off. . |
| 0412545 | 9/1991 | European Pat. Off. . |
| 2583574 | 12/1986 | France . |
| 2617668 | 1/1989 | France . |

*Primary Examiner*—Carl J. Arbes
*Attorney, Agent, or Firm*—Ernestine C. Bartlett

[57] ABSTRACT

A method of manufacturing a chip card comprising a card base in which a cover section is secured, which cover section comprises a circuit support and at least one microcircuit arranged on a lower surface of the circuit support, which lower surface faces the interior of a recess and is spaced from the inner surface of the bottom of the recess, in which method an encapsulant is applied to said inner surface. According to the invention the method comprises the following steps:

a) applying a metered mount of said encapsulant to a first part (7) of the inner surface of the bottom (6) of the recess, which first part is surrounded by a raised portion (11), which raised portion (11) itself is surrounded by a second part (8) of said inner surface in such manner that the encapsulant (36) is retained by capillarity by the raised portion (11), which is adapted to be spaced over at least a part of its circumference from the cover section (20) when said section is secured to the card base, b) fixing the cover section (20) on the card base (1), the encapsulant (36) completely filling a first volume ($V'_1$) situated between said first part (7) and the cover section (20) and partly filling a second volume ($V'_2$) situated between said second part (8) and the cover section (20).

4 Claims, 2 Drawing Sheets

METHOD OF MANUFACTURING A CHIP CARD

This is a continuation of application Ser. No. 07/892,099, filed Jun. 2, 1992, now abandoned.

FIELD OF THE INVENTION

The invention relates to a method of manufacturing a chip card comprising a card base in which a cover section is secured, which cover section comprises a circuit support and at least one microcircuit arranged on a lower surface of the circuit support, which lower surface faces the interior of a recess and is spaced from the inner surface of the bottom of the recess, in which method an encapsulant is applied to said inner surface.

BACKGROUND OF THE INVENTION

Such a method is known from the Applicant's European Patent Application 201,952 filed on 10 Apr. 1986. In accordance with this prior document a given amount of encapsulant is introduced into the recess of the card by means of an automatic metering device, after which the cover section is fitted and the card is reversed. The encapsulant then flows onto the integrated-circuit chip but remains in the recess because this is closed by the cover section. This method improves the resistance to repeated bending of the card but it does not guarantee a reproducible encapsulation of the circuit. However, for an optimum reliability of the card it is desirable that the integrated circuit and its connection wires are wholly encapsulated.

Techniques for the complete encapsulation of a chip card are known but they all exhibit comparatively large drawbacks, in particular a fairly large number of process steps.

European Patent Application 075,351 filed in the name of the Applicant and N. V. Philips on 7 Sep. 1982 teaches to arrange an integrated circuit on the bottom of a cavity in a base, which integrated circuit is electrically connected to metallised tracks on the two surfaces of the auxiliary support. Subsequently, the cavity is filled with an insulating wax which, once it has solidified, holds the integrated circuit and the connection wires in position. For this purpose a frame is arranged on the support 11 around the cavity. The assembly thus obtained consequently does not exhibit a flat surface because the frame constitutes a thicker portion, the method not being applicable in any case to a card in accordance with the cited document 201,952.

Moreover, European Patent 107,061 (N. V. Philips) describes a card having a card base formed with a cavity open to both surfaces of the card. The circuit support (4) is covered with a foil (6) at its lower surface, the circuit (5) is arranged on the foil (6) through an opening (10) in the circuit support, and subsequently the connection wires are arranged between the circuit and the circuit support. After this, an annular sealing element (8) is arranged on the circuit support so as to surround the circuit and the connection wires, and subsequently a filling substance (9) is applied in order to embed the circuit and the wires, after which the foil (6) is removed. This method has the drawback that as a result of filling with a resin it is not possible to obtain a flat surface owing to the precision attainable with automatic metering devices and owing to the capillarity effect. Therefore, a finishing operation is necessary to give the card a flat surface. This is a drawback common to all the techniques in which the cavities are filled via the back.

Thus, the cards manufactured by Messrs. Schlumberger employ a card base having a hole accommodating a polyester printed circuit MCTS carrying an integrated circuit, filling with an epoxy resin being effected via the back, after which the surplus resin is subjected to a finishing operation. It is to be noted also that, as a result of the materials used, this method has the drawback that the device is visible, which poses a problem with respect to the appearance of the product.

Another total encapsulation technology is used by Siemens. A chip is interconnected to a film by gold pads and is accommodated in a cavity in an inner layer of a card base comprising a plurality of PVC layers. This technique, which requires a plurality of layers to be stacked, is expensive.

It is an object of the present invention to solve the problem of the production costs of "total encapsulation" cards.

Until now the technology corresponding to European Patent 201,952 has been used, in which the connection wires are encapsulated only partly or not at all, the product being designed to withstand bending tests. For this, reference is made to, for example, French Patent Application FR 2,617,668 (RTC-Compelec). The card base in accordance with this technology can be realised at low cost (by moulding) and the embedding process as described in European Patent 201,952 can be automated very easily.

A known total encapsulation technology suitable for a card having a recess for a cover section is to apply and to polymerise a drop of epoxy resin on an integrated device so as to encapsulate the assembly comprising the device and the connection wires (cf. French Patent Application published under number FR 2,583,574 filed by La Société Eurotechnique on 14 Jun. 1985). In practice, a mechanical finishing operation is necessary because the applied drop forms a dome of a height H, which height must be reduced in practice in order to achieve that the thickness of the combination of printed circuit, chip and encapsulation does not exceed the limits imposed by the dimensions specified for a chip card (nominal thickness 0.8 mm). In practice, this height reduction is obtained by machining the dome so as to flatten it substantially down to the level of the connection wires.

SUMMARY OF THE INVENTION

The basic idea of the invention is to use the first method mentioned in the present Patent Application (opening paragraph, p. 1) for manufacturing totally encapsulated cards without any machining operation and without imposing a particular value on the card thickness.

To this end a method in accordance with the invention is characterised in that the method comprises the following steps:

a) applying a metered amount of said encapsulant to a first part of the inner surface of the bottom of the recess, which first part is surrounded by a raised portion, which raised portion itself is surrounded by a second part of said inner surface in such manner that the encapsulant is retained by capillarity by the raised portion, which is adapted to be spaced over at least a part of its circumference from the cover section when said section is secured to the card base, b) arranging the cover section on the card base, the encapsulant completely filling a first volume situated between said first part and the cover section and partly filling a second volume situated between said second part and the cover section.

The second volume around the raised portion serves to take up the excess encapsulant, which settles on the second part of said inner surface, as a result of which it is mechanically reinforced. This simplifies the production steps to a maximum extent, no grinding being necessary, of course. Curing of the encapsulant is suitably effected at ambient temperature. Since the cavity is closed by the cover section it is possible to test and sort out the cards before curing of the encapsulant, the purpose of this curing being merely to protect the card when it is subjected to substantial mechanical loads. Suitably, the encapsulant is a semi-rigid resin (for example, a hardness of D70 Shore) conforming to bending loads imposed by the bending tests (for example, epoxy resin ME45W from Emerson and Cuming France).

In a preferred embodiment, providing a high mechanical stability, the first volume is such that the microcircuit and the electrical connection wires between said microcircuit and the circuit support are wholly encapsulated by the encapsulant.

The invention also relates to a chip card comprising a card base having a recess in which a cover section is secured, which cover section comprises a circuit support and at least one microcircuit arranged on a lower surface of the circuit support, which lower surface faces the interior of the recess and is spaced from the inner surface of the bottom of the recess.

Such a card is known from the cited document EP 201,952.

In accordance with the invention the inner surface of the bottom of the recess comprises a raised portion which is spaced from the cover section over at least a part of its circumference, which raised portion surrounds a first part of said inner surface and is itself surrounded by a second part of said inner surface, a first volume situated between said first part and the cover section being completely fried with an encapsulant, and a second volume situated between said second part and the cover section being partly filled with said encapsulant.

The second volume serves as an expansion chamber for the first volume which is wholly filled with the encapsulant.

In a preferred embodiment providing total encapsulation said first part extends at least up to a location above which the circuit support carries solder points for the electrical connection wires between the circuit and the circuit support.

In an advantageous embodiment said encapsulant which partly fills the second volume wholly covers said second part.

The raised portion may be annular and/or of triangular cross-section.

Said first part may comprise anchoring elements for an improved mechanical stability of the assembly.

BRIEF DESCRIPTION OF THE DRAWINGS

The invention will now be described in more detail, by way of non-limitative example, with reference to the accompanying drawings, in which.

DESCRIPTION OF EMBODIMENTS

Figure 1:
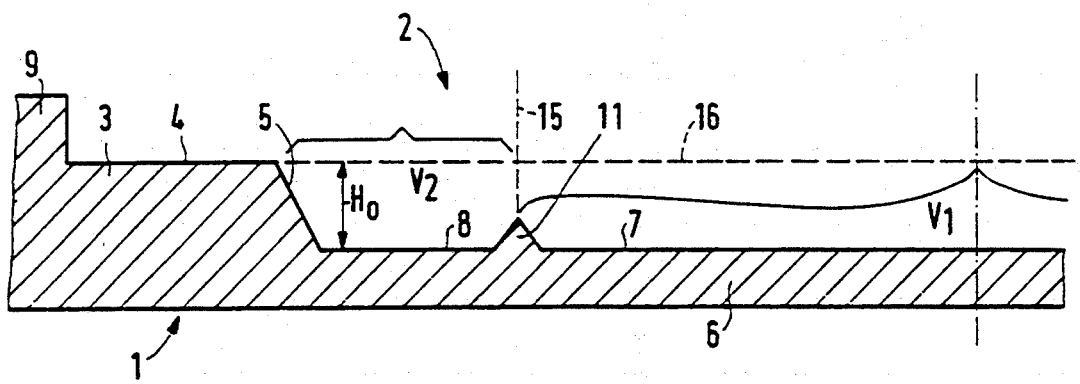
FIG. 1 is a sectional view showing a part of a card base of a card in accordance with the invention.
Figure 3:
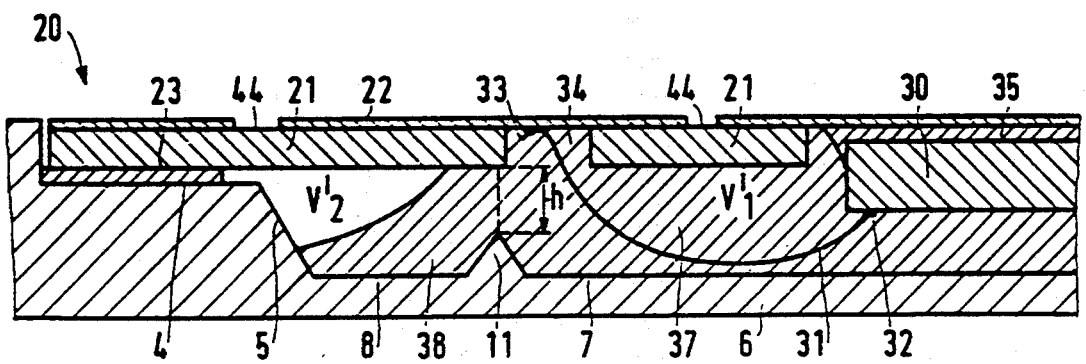
FIG. 3 is a sectional view showing a part of the finished chip card.
Figure 4:
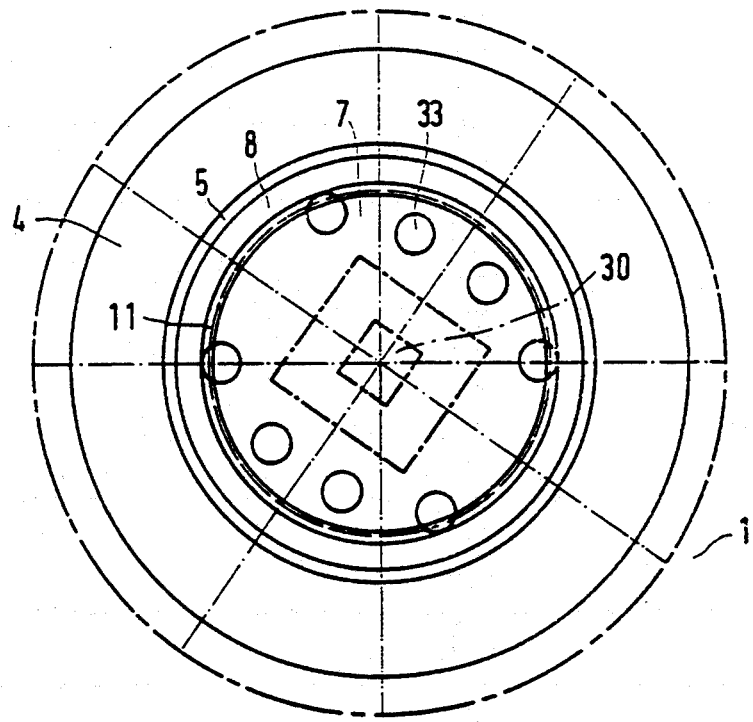
FIG. 4 is a plan view of the recess of the card base, also showing the solder points of the wires and the circuit 30.

FIG. 1 is a sectional view of a card base beating the general reference 1 and having a recess bearing the general reference 2 and formed in a card body 9. The recess 2 is adapted to receive a cover section which bears the general reference 20 in FIG. 3 and which comprises a microcircuit 30 and a microcircuit support 21. The recess 2 has an outer rim 4 for affixing the cover section 20 by means of an adhesive 23 (FIG. 3), which rim is connected to the inner surface of the bottom 6 of the recess 2 by a flared portion 5 (see also FIG. 4). A raised portion 11 forms an annular barrier of triangular cross-section which surrounds and bounds a circular part 7 of the inner surface of the bottom 6 of the recess 2. An annular part 8 of the inner surface of the bottom 6 surrounds the raised portion 11 and thus extends up to the edge 5' of the flared portion 5. A cover section 20 comprises a circuit support 21 of an insulating material and a conductive layer 22 comprising conductor tracks separated by openings such as 44, dividing them electrically into different zones to insulate of the electrical contacts points. A microcircuit 30 is glued to the layer 22 at 37. Connection wires 31 are soldered to the microcircuit 30 (at 32) and the layer 22 (at 34). For a more detailed description reference is made to the Applicant's French Patent application FR 2,580,416 filed on 12 Apr. 1985.

Figure 2:
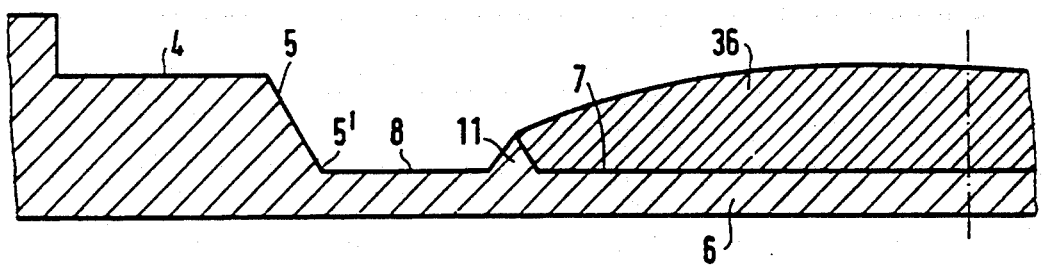
FIG. 2 is a sectional view showing a part of said card base after filling with the encapsulant (step a)

FIG. 2 illustrates the first step of the embedding process. A predetermined amount of an encapsulant, for example the two-component epoxy resin ME45W from Emerson and Cuming (semi-rigid resin particularly intended for chip cards) prepared in a proportion of 100 parts of component A to 40 pans of component B, is applied in such a way that by capillarity a dome 36 is formed on the part 7 of the bottom 6 without overflowing owing to the raised portion 11. Preferably, a multiple volumetric deposition system is used for a satisfactory distribution of the drop forming the dome 36.

$V_1$ is defined as the volume bounded by the part 7, the cylinder 15 tangent to the apex of the raised portion 11 and the plane 16 of the outer rim 4, and $V_2$ as the volume bounded by the annular part 8, the cylinder 15, the flared portion 5 and the plane 16. $H_o$ is the distance between the plane 16 and the inner surface (7, 8) of the bottom 6. The volume of the dome 36 is larger than $V_1$ and smaller than $V_1 + V_2$ by an amount to be explained with reference to FIG. 3. It is to be noted the use of an annular raised portion 11 to retain a drop of resin is known per se from Swiss Patent 619,333 filed by Faselec AG on 1 Nov. 1977. In accordance with said Patent a semiconductor is arranged inside the annular space defined by the raised portion and is encapsulated with a resin, which remains on the raised portion by capillarity. In accordance with this prior art, once the resin has been deposited in such a manner that the dome encapsulating the device has the desired shape, the resin is polymerised and encapsulation is finished. The resin keeps its dome shape, with all the drawbacks mentioned hereinbefore.

Conversely, in accordance with the invention, the cover section 20 is subsequently arranged on the rim 4, preferably by means of an adhesive 23, the circuit 30 facing the interior of the recess 2. The cover sections 20 are cut by the insertion machine and they are positioned above the recess 2 and pressed onto the card base to ensure adhesion to the applied adhesive 23. The excess amount 38 of encapsulant of the dome 36 flows in outward directions over the upper edge of the raised portion 11 (having a distance h from the cover section) and spreads on the annular portion 8 without contacting the adhesive 23 which may be present. During this operation air bubbles present in the encapsulant are also expelled.

$V'_1$ is the volume bounded by the part 7, the cylinder 15 and the cover section 20 once fitted. The remaining encapsulant 37 fills the volume $V'_1$. $V'_2$ is the volume bounded by the part 8, the cylinder 15, the flared portion 5 and the cover section 20. The excess amount 38 of encapsulant needs to fill the volume $V'_2$ only partly. If the thickness of the adhesive 23 is ignored this means that $V'_2$ is substantially equal to $V_2$. In contrast, $V'_1$ is smaller than $V_1$ because the circuit 30 extends inside the recess 2 above the part 7 ($V'_1 < V_1$). The volume of the encapsulant to be applied in order to form the dome 36 should comply with $$V_p < V'_1 + V'_2 \simeq V_1 + V_2$$

If $V_{IC}$ is the volume of the circuit 30 one may write $$V_p < V_1 + V_2 - V_{IC}$$

It is obvious that in practice allowance is to be made for variations of the volume of the resin during its polymerisation.

Since the recess 2 is sealed hermetically as a result of the cover section 20 being glued into said recess the encapsulant need not be cured rapidly. Of course, the card should not be subjected to excessive mechanical stresses until polymerisation is complete but it is possible to test, sort out and stock the cards. The afore-mentioned resin ME45W polymerises in 24 hours at ambient temperature.

The raised portion 11 is situated at a distance h from the underside of the circuit support 21 once the latter has been mounted in the recess 2. This allows the encapsulant 36 to flow towards the volume $V'_2$ situated above the annular part 8.

As a result of this, the raised portion 11 need not be spaced from the cover section 20 over its entire circumference. It is adequate if the raised portion has one or more passages for the encapsulant 36.

In accordance with the invention the drawbacks of the prior art are thus avoided, particularly the need to machine the encapsulant mechanically in order to keep the thickness of the card within the specified tolerances.

The card base 2 can be made of polyvinyl chloride, the recess being formed by machining, or preferably of a mouldable material (ABS).

The dimensions of the cover section and the shape and the dimensions of the recess 2 may be adapted to receive large chips 30 ($\simeq 20$ mm$^2$).

The shapes, particularly of the raised portion 11, are not necessarily rotationally symmetrical and may be adapted to the geometry of the device and the solder points 33 of the cover section.

Preferably, the solder points 33 of the cover section lie within the perimeter of the raised portion 11 ($V'_1$) (see FIG. 4) to ensure that the ends of the wires are embedded. This is an important requirement affecting the reliability of the product because partial encapsulation of a wire may lead to its breakage during bending tests, a discontinuity in the encapsulation resulting in a substantial and local increase of the stresses exerted on the wire.

EXAMPLE outer diameter of the rim 4: 16.3 mm,
inner diameter of the rim 4: 11.3 mm,
diameter at the edge 5' of the portion 5: 10.7 mm,
inner diameter of the raised portion 11: 8.8 mm,
outer diameter of the raised portion 11: 9.4 mm,
height of the raised portion 11: 0.2 mm,
distance $H_o$: 0.6 mm,
volume of the applied resin: approximately 38 mm$^3$.

The crushing strength of the module comprising the cover section plus encapsulation is excellent, which contributes to the reliability of the product and mitigates the problem of magnetic losses as a result of a deformation of the cover section 20 and the card bottom 6 while passed through magnetic-track readers.

Fillers may be added to the encapsulant to improve its thermal conduction and/or to protect the device against electrostatic fields.

Figure 5:
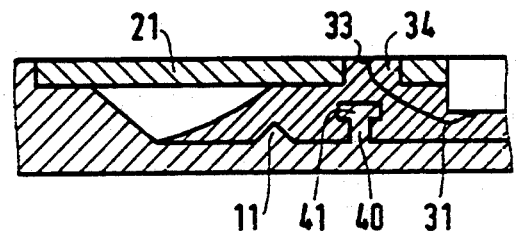
FIG. 5 shows a modification of FIG. 4.

The adhesion of the encapsulant may be improved by providing the card bottom 6 with anchor elements (40, 41) (FIG. 5) to increase the area of contact between the resin and the card bottom.

The strong adhesion between the encapsulant 36 and the and the card bottom 6 also guarantees that the cover section 20 is non-removable (which is an important feature for certain uses). Any attempt to detach the cover section 20 will result in the device being destroyed (tearing loose of the wires 31 and loosening of the chip 30).

The invention is not limited to the embodiments described and shown herein. The raised portion 11 need not be continuous. It should merely be capable of retaining a drop of encapsulant by capillarity. It may be constituted, for example, by a series of spaced-apart pegs arranged on a continuous base. The spacings between the pegs then form the spacings between the raised portion 11 and the cover section.

The invention relates to all types of card, including contactless cards, which may not comprise electrical connection wires.

The term card is not to be taken in its strictest sense. The invention also applies to all types of flat supports, such as for example remote-control keys for locking automobiles.

I claim:

1. A method of manufacturing a chip card comprising a card base in which a cover section is secured, which cover section comprises a circuit support and at least one microcircuit arranged on a lower surface of the circuit support, which lower surface faces the interior of a recess and is spaced from the inner surface of the bottom of the recess, in which method an encapsulant is applied to said inner surface, characterised in that the method comprises the following steps:

a) applying a metered amount of said encapsulant to a first part (7) of the inner surface of the bottom (6) of the recess, which first part is surrounded by a raised portion (11), which raised portion (11) itself is surrounded by a second part (8) of said inner surface in such manner that the encapsulant (36) is retained by capillarity by the raised portion (11), which is adapted to be spaced over at least a part of its circumference from the cover section (20) when said section is secured to the card base, b) arranging the cover section (20) on the card base (1), the encapsulant (36) completely filling a first volume ($V'_1$) situated between said first part (7) and the cover section (20) and partly filling a second volume ($V'_2$) situated between said second part (8) and the cover section (20).

2. A method as claimed in claim 1, characterised in that the encapsulant (36) is cured at ambient temperature.

3. A method as claimed in claim 1 characterised in that the encapsulant (36) is a semi-rigid resin.

4. A method as claimed in claim 1 characterised in that the first volume ($V'_1$) is such that the microcircuit (30) and electrical connection wires (31) between said microcircuit and the circuit support (21) are wholly encapsulated by the encapsulant.

* * * * *